United States Patent [19]
Krumrein et al.

[11] 3,943,384
[45] Mar. 9, 1976

[54] MONOSTABLE TRIGGER ARRANGEMENT

[75] Inventors: Gerhard Krumrein; Joachim Kuhlmann, both of Heilbronn, Germany

[73] Assignee: Licentia Patent-Verwaltungs G.m.b.H., Frankfurt am Main, Germany

[22] Filed: Apr. 23, 1974

[21] Appl. No.: 463,361

[30] Foreign Application Priority Data
Apr. 27, 1973 Germany............................ 2321255

[52] U.S. Cl.................................. 307/273; 307/284
[51] Int. Cl.² ...................... H03K 3/10; H03K 3/35
[58] Field of Search ............ 307/273, 284; 328/207, 328/194–196

[56] References Cited
UNITED STATES PATENTS

| | | |
|---|---|---|
| 3,282,632 | 11/1966 | Arsem................................. 307/273 |
| 3,323,074 | 5/1967 | Neal..................................... 307/273 |
| 3,681,622 | 8/1972 | Dalyai................................. 307/273 |
| 3,735,154 | 5/1973 | Meeker et al....................... 307/273 |

Primary Examiner—Stanley D. Miller, Jr.
Attorney, Agent, or Firm—Spencer & Kaye

[57] ABSTRACT

A monostable trigger arrangement comprises a monostable trigger stage controlled by a switch unit which is triggered by a control pulse to release a pulse from the monostable trigger stage and is returned to its untriggered state by an erase signal.

5 Claims, 2 Drawing Figures

MONOSTABLE TRIGGER ARRANGEMENT

BACKGROUND OF THE INVENTION

The invention relates to a monostable trigger arrangement.

The invention is based on the knowledge that in the case of a monostable trigger stage, it can occur that more pulses than foreseen are released as a result of disturbing pulses which are caused for example by potential fluctuations. This is not acceptable for many purposes. Thus for example, in the transformation of the output pulses of a phase segment control with pulse repeaters per half wave of the mains frequency, only one output pulse may be produced, since pulse repeaters can no longer be demagnetized, if a supersaturation occurs as a result of the double pulse formation.

SUMMARY OF THE INVENTION

It is an object of the invention to provide a monostable trigger stage which with disturbing pulses does not release any undesired pulses.

According to a first aspect of the invention, there is provided a monostable trigger stage, characterized in that a switch unit is provided which is triggered by a controlling pulse and in so doing releases an output pulse of the trigger stage, in that the triggered stage of the switch unit persists up to the arrival of an erase or reset signal, and in that the triggered switch unit merely responds to the erase signal, which returns the switch unit again to the untriggered state.

According to a second aspect of the invention, there is provided a monostable trigger arrangement comprising a monostable trigger stage for producing output pulses, a switch unit connected in front of the monostable trigger stage for controlling said monostable trigger stage and means for applying a control pulse to the switch unit to trigger said switch unit and release a pulse from the monostable trigger stage and for applying an erase signal to the switch unit for returning the switch unit to its untriggered state.

BRIEF DESCRIPTION OF THE DRAWING

The invention will now be described by way of example, with reference to the drawings wherein.

DESCRIPTION OF THE PREFERRED EMBODIMENT

Basically, the invention proposes that a switch unit be provided which is triggered by a control pulse, in so doing, an output pulse of the trigger stage is released, which switch unit persists in the triggered state up to the arrival of an erase signal and in the triggered state merely responds to the erase signal, which returns the switch unit again into the untriggered state.

The switch unit has for example a thyristor which is brought into the conductive state by the controlling pulse and back into the blocking state by the erase signal. As a result of an appropriate circuit in conjunction with the thyristor, the switch unit is prevented from responding to undesired pulses. For as long as the thyristor is in the conducting state no disturbing pulse can release a pulse from the monostable trigger stage. Only if the thyristor is transferred by a certain erase signal from the conducting state into the blocking state, can the monostable trigger stage respond to a pulse. Thus for example if it is to be achieved that during one period of a pulse controlling the monostable trigger stage, no disturbing pulse releases an undesired pulse of the monostable trigger stage, then care is taken that, as a result of the control pulse releasing the monostable trigger stage, the thyristor, connected in front, is brought from the blocking into the conducting state which is maintained until the arrival of the erase signal at the end of the period. If the switch unit is so constructed in conjunction with the monostable trigger stage that disturbing pulses, in the conducting state of the thyristor, cannot reach the monostable trigger stage or actuate the latter, then obviously the monostable trigger stage only emits one pulse during the period in question, which pulse is released in the desired manner by a control pulse, while disturbing pulses do not have any effect during this period due to the conducting state of the thyristor and thus cannot release any further undesired pulse of the monostable trigger stage. For example, a bistable trigger stage can be provided instead of a thyristor as the store element.

Figure 1:
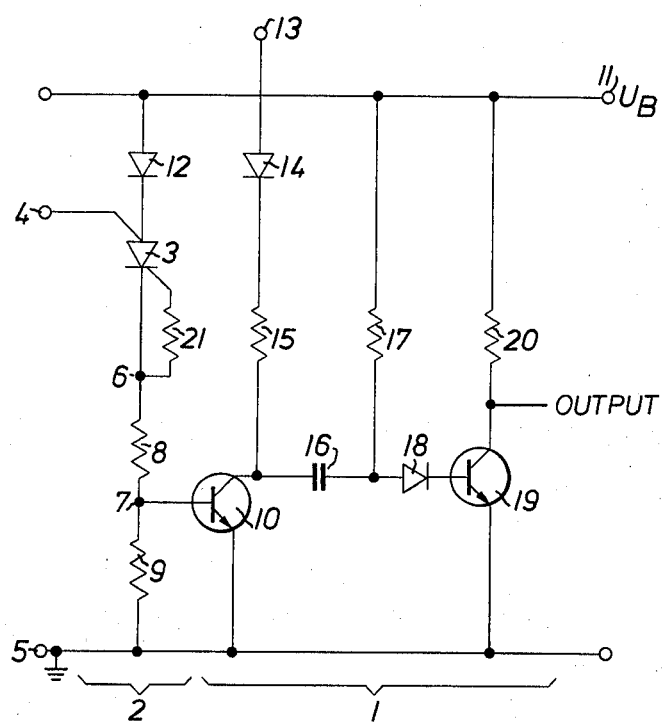
FIG. 1 is a circuit diagram of one embodiment of the invention.

Referring now to the drawings, FIG. 1 shows a monostable trigger stage 1 and a switch unit 2 connected in front thereof in accordance with the invention, which switch unit can also be referred to as a store circuit on account of its storing properties.

A thyristor 3, which is provided as the store and switch element, forms the most important part of the switch unit 2. The store unit 2 is controlled by a control pulse which is fed between the gate or trigger electrode 4 of the thyristor and the ground point 5 of the switch unit. A control pulse arriving at the gate electrode 4 acts, in the blocked state of the thyristor, such that the thyristor is first switched through, i.e. is brought into the conducting state from the blocking state. If the thyristor 3 is switched through, then the point 6 of the circuit receives approximately the potential of the gate electrode 4 (approximately 1V below that) and the point 7 of a voltage divider comprising resistances 8 and 9 receives such a potential that the transistor 10 becomes conductive. If the operating voltage between point 11 and the ground point 5 is for example 15V, then a resistance value of 10 KOhm is recommended for the resistance 8, a resistance value of 4.7 KOhm for the resistance 9 and a resistance value of 15 KOhm for the resistance 21. The resistance 21 has the task, after application of the erase signal at gate 4, of providing a rapid switch-off of the thyristor 3. The diode 12 takes care that the thyristor blocks safely. The diode 12 is so connected in the circuit that the current flow through the diode 12 is cut off by a voltage at point 4 which corresponds to the potential of point 11 (erase signal).

If the thyristor is switched through by the control pulse and also the emitter-collector path of the transistor 10 is made conductive, the monostable trigger stage 1 produces a pulse as required. This pulse occurs in that, as a result of the switch operation of the transistor 10, the plate or coating of the capacitance 16 leading to the diode 18 assumes a negative voltage. The transistor 19 controlled previously by means of the resistance 17 and the diode 18 is in this way blocked and the collector potential of the transistor 19 assumes the potential of the point 11.

The time for the blocking phase of the transistor 19 is determined by the discharge time of the capacitance 16 through the resistance 17. The blocking phase of the transistor 19 is the output pulse time of the monostable trigger stage 1, the signal of which can be taken off at the collector of the transistor 19.

The output pulse can only arise in the monostable trigger stage 1 if, during the time duration of the erase signal applied to gate 4, point 13 is at a positive potential, preferably at the potential of point 11 and thus the capacitor 16 determining the pulse time charges up to almost the potential of the point 11.

The diode 14 has the task of seeing that no premature discharge through the resistance 15 takes place at the termination of the charging operation of the capacitance 16 by the application of a voltage at the potential of point 5. The diode 14 in this case is in the blocked state. The diode 18 prevents the breakthrough of the base-emitter characteristic of the transistor 19 for the case in which the plate or coating of the capacitance facing the diode 18 assumes a negative potential.

If the operational voltage between the point 11 and the ground point amounts to, for example, 15V, then a resistance value of 680 Ohm is recommended for the resistance 15, for example, and a resistance value of 8.2 KOhm is recommended for the resistance 20, for example.

If the output pulse time of the monostable trigger stage 1 amounts to, for example, 1.5 ms, then, for example, a capacitance value of 47 nF is recommended for the capacitance 16 and a resistance value of 50 KOhm is recommended for the resistance 17.

Figure 2:
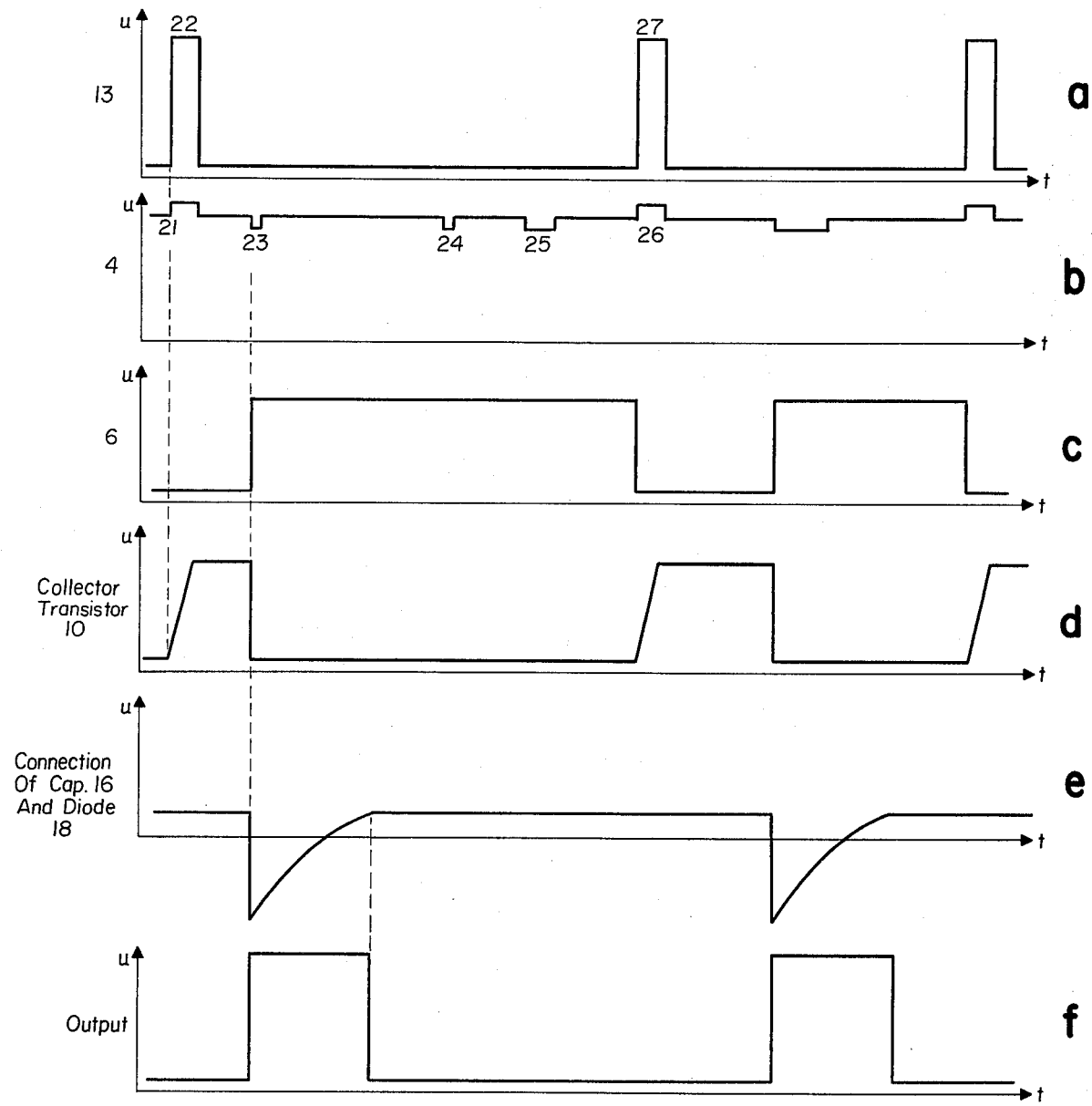
FIG. 2 shows the waveforms at the input, at the output and at various locations of the circuit of FIG. 1.

The operation of the circuit of FIG. 1 will now again be briefly described with reference to FIG. 2. With the thyristor 3 in its conductive state, the application of an erase or reset signal 21 (FIG. 2b) to the gate 4 of thyristor 3 will switch the thyristor 3 back to its non-conducting state and the switch unit 2 to its untriggered state. At the same time, a charging signal 22 (FIG. 2a) applied to the point or terminal 13 causes the capacitor 16 to be charged via resistor 15 in order to enable the monostable trigger stage 1 to produce an output pulse.

A control pulse 23 (FIG. 2b) subsequently applied to the gate 4 switches the thyristor 3 to its conductive state which is maintained until the application of another erase or reset pulse to the gate 4, as indicated by the rise in the voltage at point 6 (FIG. 2c). The rise in the voltage at point 6 causes the transistor 10 to become conductive and its collector voltage to drop (FIG. 2d). This causes the plate of the capacitor 16 connected to the diode 18 to assume a negative voltage (FIG. 2e) which blocks the previously conductive transistor 19, resulting in the desired output pulse (FIG. 2f) at its collector.

As long as the thyristor 3 is in the conductive state, any further control signals, e.g. signals 24, 25 of FIG. 2b, are ineffective and will not lead to the generation of an output pulse at the collector of transistor 19. Only upon the occurrence of a further erase or reset pulse 26 at gate 4 (FIG. 2b) and a charging pulse 27 at point 13 (FIG. 2a) will the circuit of FIG. 1 be able to respond to a subsequent control pulse to produce a further output pulse at the collector of transistor 19.

It will be understood that the above description of the present invention is susceptible to various modifications changes and adaptations.

What is claimed is:

1. A monostable trigger arrangement comprising: a monostable trigger stage for producing an output pulse; a bistable switching circuit means having its output connected to said monostable trigger stage, and responsive to a control pulse for switching said bistable switching circuit means from an untriggered state to a triggered state and to an erase pulse for switching same from said triggered state back to said untriggered state, for controlling said monostable trigger stage to release an output pulse only when said switching circuit means is switched to said triggered state, said bistable switching circuit means including a thyristor connected across a pair of voltage supply terminals and having a single gate electrode for receipt of said control and said erase pulses, said thyristor being rendered conductive, and thus switched to said triggered state, in response to a control pulse applied to said gate electrode, and being rendered nonconductive, and thus switched back to the untriggered state, in response to an erase pulse applied to said gate electrode.

2. A monostable trigger arrangement as defined in claim 1, wherein said erase signal is fed to said gate electrode at a certain time point of the period of said control pulse.

3. A monostable trigger arrangement as defined in claim 2, wherein said erase signal is fed to said gate electrode at the end of a period of said controlling pulse.

4. A monostable trigger arrangement as defined in claim 1 wherein said switching circuit means further includes a voltage divider connected in series with said thyristor between said voltage supply terminals, and wherein said monostable trigger stage includes a first transistor having its base connected to the output of said voltage divider and controlled by the output voltage of same so that said first transistor will be rendered conductive when said thyristor is in the conductive state.

5. A monostable trigger arrangement as defined in claim 4 wherein said first transistor has its base-emitter path connected between said output of said voltage divider and one of said pair of voltage supply terminals and its collector connected to an input terminal for a source of pulsed charging voltage; and wherein said monostable trigger stage further includes a second transistor having its emitter collector path connected between said pair of voltage supply terminals, circuit means connected to the base of said second transistor for normally biasing same into the blocking state, and a capacitor connected between the collector of said first transistor and the base of said second transistor.

\* \* \* \* \*